US010084386B2

(12) United States Patent
Werner et al.

(10) Patent No.: US 10,084,386 B2
(45) Date of Patent: Sep. 25, 2018

(54) BJT DRIVER WITH DYNAMIC ADJUSTMENT OF STORAGE TIME VERSUS INPUT LINE VOLTAGE VARIATIONS (71) Applicant: Power Integrations, Inc., San Jose, CA (US)

(72) Inventors: Antonius Jacobus Johannes Werner, Cambridge (GB); Manoj Bhasin, Cambridge (GB); Matthew David Waterson, Cambridge (GB); Adrian Kirilov Lefedjiev, Gamlingay (GB)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 15/363,733

(22) Filed: Nov. 29, 2016

(65) Prior Publication Data

US 2017/0077826 A1  Mar. 16, 2017

Related U.S. Application Data (63) Continuation of application No. 14/732,413, filed on Jun. 5, 2015, now Pat. No. 9,525,333.

(51) Int. Cl.
*H02M 3/335* (2006.01)
*H02M 1/08* (2006.01)
(Continued)

(52) U.S. Cl.
CPC ......... *H02M 3/33523* (2013.01); *H02M 1/08* (2013.01); *H02M 3/33507* (2013.01);
(Continued)

(58) Field of Classification Search
CPC ......... H02M 3/33507; H02M 3/33523; H02M 3/33592; H02M 2001/0032; H02M 2007/4815; Y02B 70/1433
(Continued)

(56) References Cited

U.S. PATENT DOCUMENTS 4,318,011 A   3/1982  Zeis
5,017,802 A   5/1991  Feldtkeller
(Continued)

FOREIGN PATENT DOCUMENTS

CN   102957304      3/2013
WO   WO 83/00590 A1  2/1983
(Continued)

OTHER PUBLICATIONS

PRC (China) Application No. 201410242007.4—First Office Action and Search Report with English Translation dated Sep. 29, 2017, 22 pages.

*Primary Examiner* — Yemane Mehari
(74) *Attorney, Agent, or Firm* — Christensen O'Connor Johnson Kindness PLLC (57) ABSTRACT A controller for a power converter includes a driver circuit that generates a control signal to switch a power switch in response to an output, and a control circuit that controls the switching of the power switch. The control circuit includes a storage time reference circuit generates a storage time reference signal responsive to an input. A first comparator generates a collector off signal in response to a comparison of a switch current sense signal and a collector off reference signal. A storage time regulator circuit generates a base off reference signal in response to the storage time reference signal and the collector off signal. A second comparator generates a base off signal in response to a second comparison of the switch current sense signal and the base off reference signal. The driver circuit is coupled to discontinue and start charging a base terminal of the BJT power switch.

16 Claims, 5 Drawing Sheets (51) Int. Cl.
*H03K 17/0412* (2006.01)
*H03K 17/14* (2006.01)
*H02M 1/00* (2006.01)

(52) U.S. Cl.
CPC ....... *H03K 17/04126* (2013.01); *H03K 17/14* (2013.01); *H02M 2001/0003* (2013.01); *H02M 2001/0022* (2013.01)

(58) Field of Classification Search
USPC .................................................... 363/21.16
See application file for complete search history.

(56) References Cited

U.S. PATENT DOCUMENTS

| | | | |
|---|---|---|---|
| 5,019,955 A | 5/1991 | Hoeksma | |
| 6,348,819 B1 | 2/2002 | Ten Pierick et al. | |
| 6,377,087 B1 | 4/2002 | Gradzki | |
| 7,218,164 B2 | 5/2007 | Vitale et al. | |
| 7,362,147 B2 | 4/2008 | Rebholz-Goldmann | |
| 7,567,445 B2 | 7/2009 | Coulson et al. | |
| 7,944,722 B2 | 5/2011 | Coulson et al. | |
| 8,446,746 B2 | 5/2013 | Coulson et al. | |
| 8,634,212 B2* | 1/2014 | Tang | H02M 3/33507 363/21.15 |
| 8,659,345 B2 | 2/2014 | Xu et al. | |
| 9,042,126 B2 | 5/2015 | Cheng et al. | |
| 2010/0165666 A1* | 7/2010 | Wang | H02M 3/33523 363/21.01 |
| 2010/0202165 A1 | 8/2010 | Zheng et al. | |
| 2010/0289463 A1* | 11/2010 | Wang | H02M 3/33523 323/247 |
| 2011/0026279 A1* | 2/2011 | Li | H02M 3/3376 363/25 |
| 2011/0096572 A1 | 4/2011 | Liang et al. | |
| 2012/0250360 A1* | 10/2012 | Orr | H02M 3/3376 363/21.02 |
| 2014/0009974 A1 | 1/2014 | Shen et al. | |
| 2014/0009977 A1 | 1/2014 | Huang et al. | |
| 2014/0056036 A1 | 2/2014 | Pan et al. | |
| 2014/0232187 A1 | 8/2014 | Ryan et al. | |
| 2014/0233269 A1 | 8/2014 | Feng et al. | |
| 2014/0355314 A1 | 12/2014 | Ryan et al. | |
| 2015/0016151 A1* | 1/2015 | Bhasin | H02M 1/08 363/20 |
| 2016/0359403 A1 | 12/2016 | Werner et al. | |

FOREIGN PATENT DOCUMENTS

WO   WO 2008/132508 A2   11/2008
WO   WO 2008/132509 A2   11/2008

* cited by examiner

BJT DRIVER WITH DYNAMIC ADJUSTMENT OF STORAGE TIME VERSUS INPUT LINE VOLTAGE VARIATIONS

REFERENCE TO RELATED APPLICATIONS

This application is a continuation of U.S. patent application Ser. No. 14/732,413, filed on Jun. 5, 2015, now pending. U.S. patent application Ser. No. 14/732,413 is hereby incorporated by reference.

BACKGROUND INFORMATION

Field of the Disclosure

The present invention relates generally to switched mode power converters utilizing a Bipolar Junction Transistor (BJT) as a switching element. More specifically, the present invention is directed to the measurement and prediction of the BJT storage time to provide a sufficient turn-off delay time for the improved performance of a power converter.

Background

Electronic devices (such as cell phones, tablets, laptops, etc.) use power to operate. Switched mode power converters are commonly used due to their high efficiency, small size, and low weight to power many of today's electronics. Conventional wall sockets provide a high voltage alternating current. In a switching power converter, a high voltage alternating current (AC), 50 or 60 Hz, input is converted through high frequency (HF) switching of a switching element with controlled on and off states to provide a well-regulated direct current (DC) output through an energy transfer element to a load. The desired output is provided by varying the duty cycle (ratio of the on-time to the total switching period, known as pulse width modulation (PWM), varying the switching frequency, which is known as pulse frequency modulation (PFM), or by skipping some switching pulses per the load change requirement, which is known as on-off control.

With stringent energy saving regulations for power converters, there are continuing efforts to provide improved operation and high efficiency in power converters. One important parameter in an improved and efficient power converter is an optimized switching function. Switching elements of the power converter affect the efficiency of the power converter by contributing to both the conduction loss and switching loss, which form a major part of the power loss in the power converter.

MOSFET, BJT, IGBT or other types of semiconductor switches may be used in switched mode power converters as a switching element. Each of these types of electronic/semiconductor switches may require specific driving provisions for efficient performance. BJT switches are fast and efficient devices for switching. However, due to their junction stored charge, BJT switches require special provisions in order to have an efficient turn off.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, example power converters utilizing a BJT power switch as a switching element with improved operation and performance are disclosed. In one example, an improved controller block for driving a BJT power switch element of a power converter is introduced. The input line voltage is dynamically monitored and modeled, and a storage time reference is generated in response to the input line voltage. In the example, the BJT base turn off and storage time of the BJT are dynamically adjusted each switching cycle in response to the storage time reference to insert a controlled BJT turn off delay in each switching cycle in response to a dynamically derived BJT storage time reference in accordance with the teachings of the present invention.

For instance, in one example, a controller block is disclosed with dynamic adjustment of the BJT storage time reference to drive a BJT switching element of a power converter that optimizes or enhances the BJT switching performance, reduces the switching loss and avoids or reduces the temperature rise of the BJT. The controller block monitors or models the input line voltage each switching cycle and generates references and thresholds for the collector current and base current turn off. In one example, the BJT driver in the controller block includes a base drive switch and an emitter drive switch to be controlled individually through the controller. A storage time reference is generated in response to the input line voltage. The BJT base turn off and storage time of the BJT is dynamically adjusted in each switching cycle in response to the storage time reference. A controlled BJT turn off delay is achieved in each switching cycle based on the dynamically derived BJT storage time reference.

Figure 1:
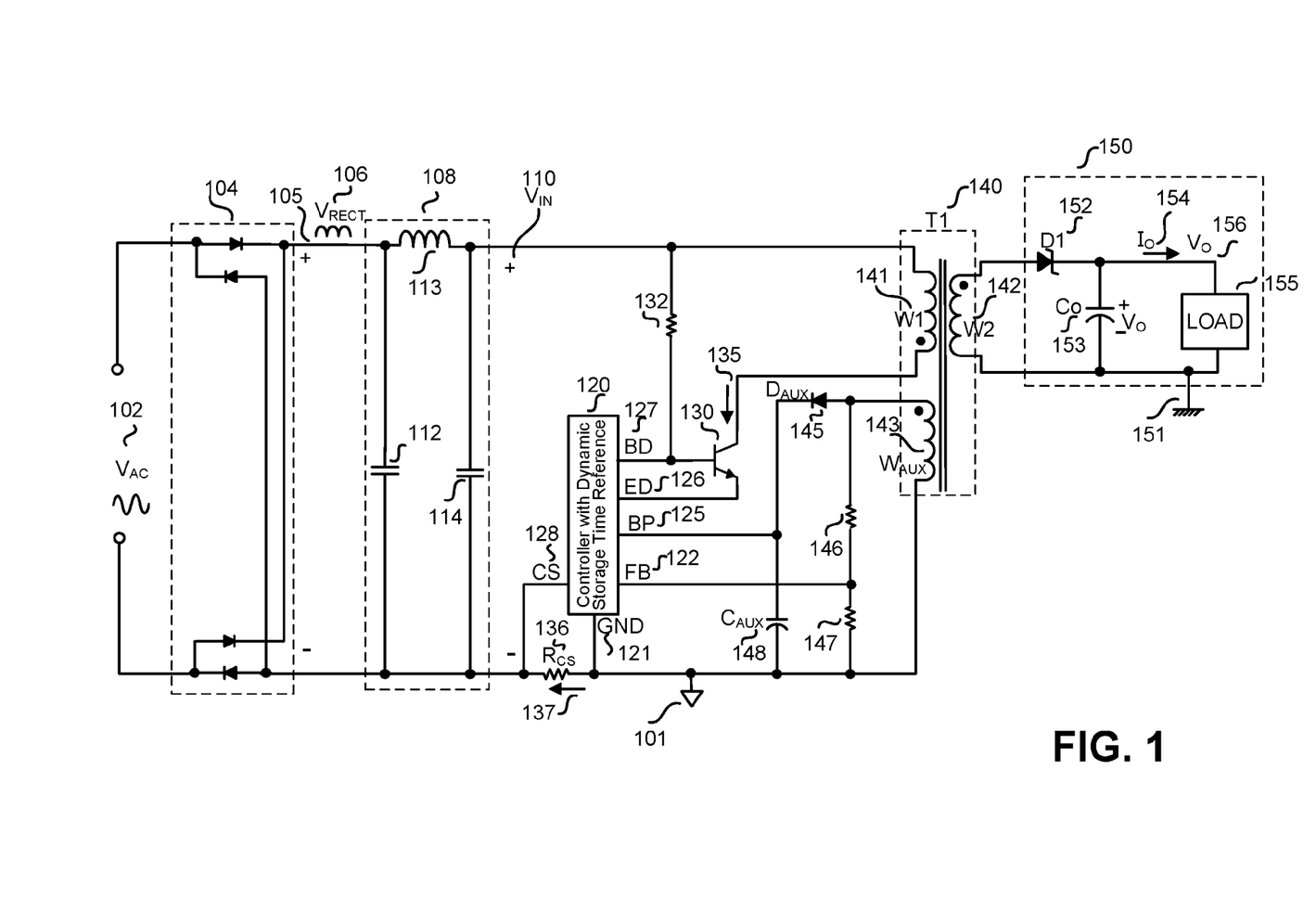
FIG. 1 is a block diagram illustrating one general example of a power converter based on the teachings of the present invention utilizing a BJT controller with dynamic storage time reference.

In an example of typical power converter illustrated in FIG. 1, the switching element 130 is coupled to the energy transfer element, transformer T1 140, which in a flyback power converter is a coupled inductor acting like a transformer, and is controlled by a controller 120 that includes the Dynamic Storage Time Reference Adjustment function in accordance with the teachings of the present invention. The AC line $V_{AC}$ 102 is coupled to the full bridge rectifier 104 that generates rectified voltage 105 to the power converter. In an example in which there is no input bulk capacitor, the full wave rectified voltage keeps the half sinusoidal waveform $V_{RECT}$ 106 applied to the power converter through the input filter 108, which includes inductor 113, and capacitors 112 and 114 as shown. The full wave rectified input voltage $V_{IN}$ 110 is applied to the primary side of power converter. The primary winding 141 of transformer T1 140 is coupled to the input line, and secondary winding 142 of transformer T1 140 is coupled to the output circuitry 150, which in example illustrated in FIG. 1 includes a rectifier, which in the depicted example is implemented with a fast Schottky diode 152, and a bulk filter capacitor Co 153 that generates the output DC voltage Vo 156 across the load 155 with output current Io 154.

In the illustrated example, output regulation is provided through processing of the feedback from the output. The feedback signal from the output may be provided through an isolated or non-isolated sense circuit. When the feedback is referenced to the secondary ground, it is referred as the secondary control. In some power converters, the output sense may be extracted indirectly from an auxiliary winding magnetically coupled to the output/secondary winding so that the feedback signal may be referenced to the primary ground, and is therefore referred to as the primary control. The auxiliary winding may also provide operating power for controller, and is sometimes referred to as a bias or bypass winding.

Figure 3:
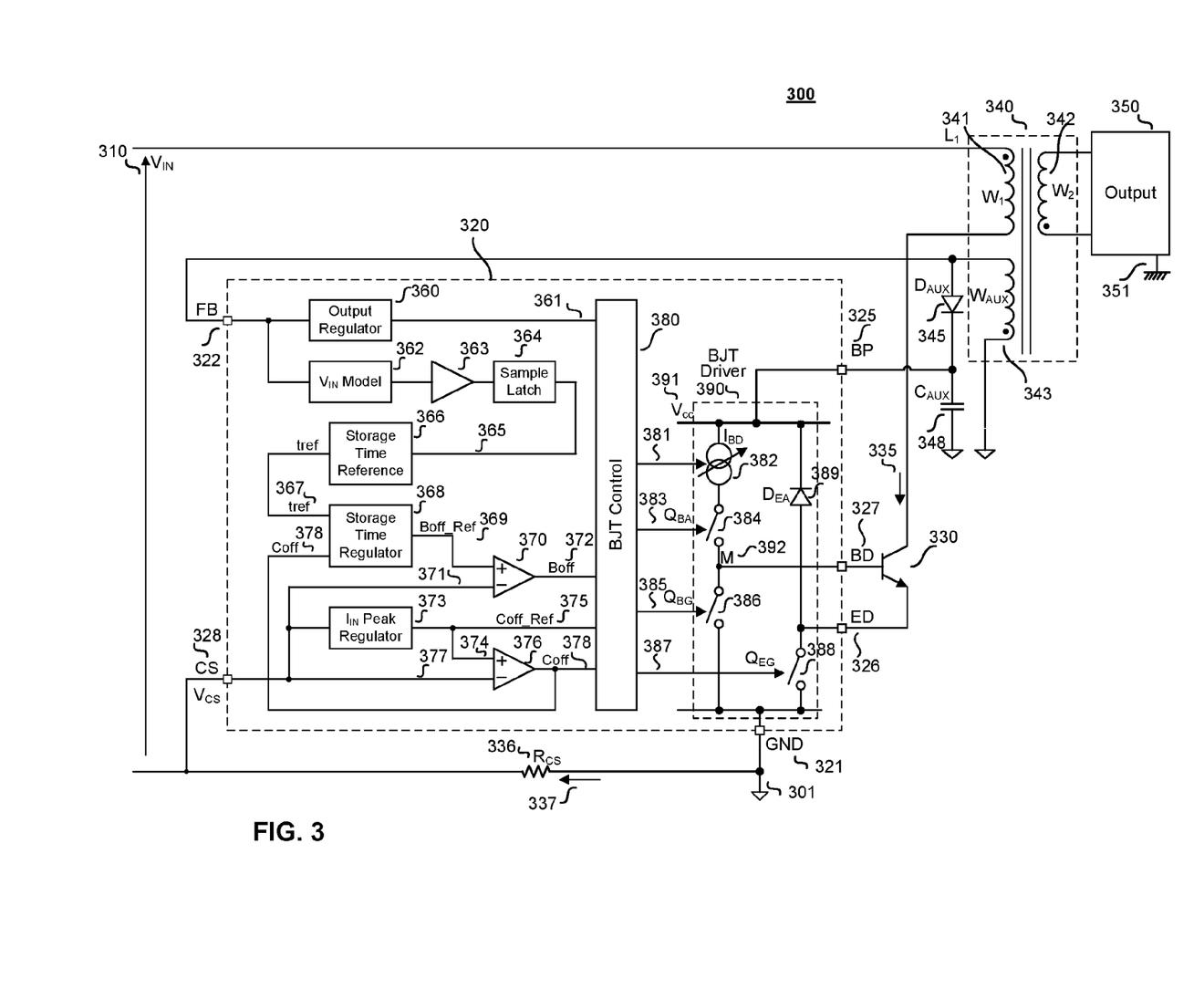
FIG. 3 illustrates interconnections of example BJT controller blocks with a dynamic storage time reference in accordance with the teachings of the present invention.

In example depicted in FIG. 1, the output ground/reference 151 is isolated from input ground/reference 101. A third/auxiliary winding 143 on the magnetic core of transformer T1 140 generates a supply voltage across the supply terminal (bypass pin) BP 125 of the controller 120 through a rectifier diode 145 and a filter capacitor $C_{AUX}$ 148. Auxiliary winding 143 is referenced to the primary ground 101 that is coupled to the GND terminal 121 of the controller 120. The feedback information for regulating output, through a resistive divider including resistors 146 and 147, is retrieved indirectly from the auxiliary winding 143 coupled to feedback terminal FB 122 of the controller 120. In one example, the feedback information could be retrieved without scaling down through the resistive divider as illustrated in FIG. 3, depending on the primary to auxiliary windings turns ratio (e.g., $N_{WAUX}/N_{W1}$). In one example, the auxiliary winding $W_{AUX}$ 143 is an anti-direction winding compared to the primary winding W1 141, and provides a non-rectified AC induced voltage to the FB terminal 122 of the controller 120.

In the depicted example, the input and output voltage detection is monitored through the AC induced voltage in the auxiliary winding $W_{AUX}$, which is wound on the energy transfer element T1 transformer in an anti-direction relative to the primary winding W1. During the on-time when the BJT switch is conducting, the negative voltage induced in the auxiliary winding $W_{AUX}$ represents the input voltage. During off-time when the BJT switch is not conducting, the induced positive voltage in the auxiliary winding $W_{AUX}$, as the FB signal, represents the output voltage of the power converter. It is appreciated that in discontinuous conduction mode (DCM) operation when the induced voltage in the auxiliary winding $W_{AUX}$ drops towards zero, the idle oscillations in the voltage that occur due to the parasitic capacitances may go to the negative direction as well. In another example, it is appreciated that the input voltage of power converter could be monitored by measuring a required current injected through an internal current source to clamp the negative portions of the induced AC voltage in the auxiliary winding $W_{AUX}$ 143 to zero.

Figure 4A:
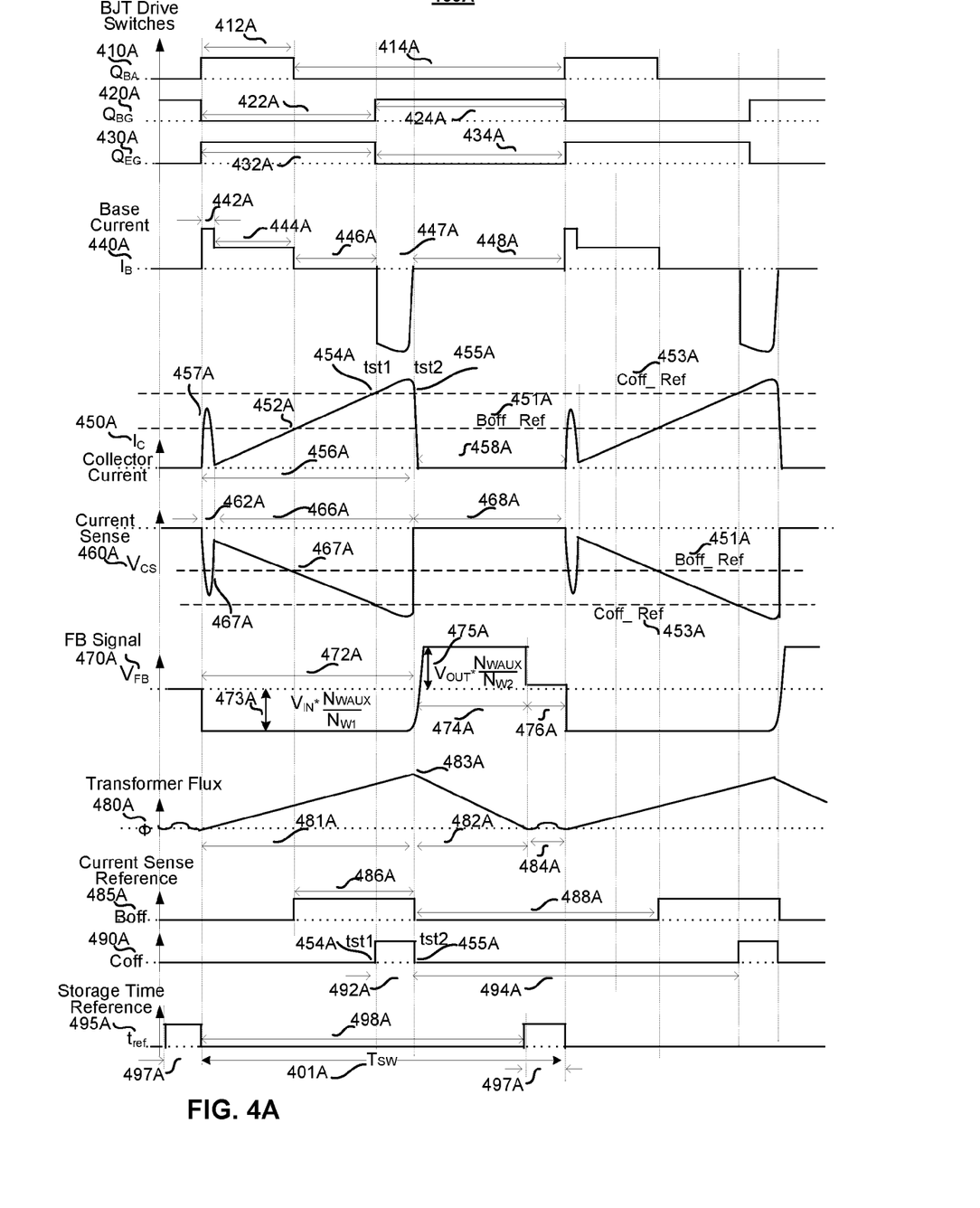
FIG. 4A is a graph illustrating waveforms and relationships between example signals with a low line for a BJT controller blocks with dynamic storage time reference in accordance with the teachings of the present invention.

The emitter and base terminals of the BJT switching element 130 are coupled to the terminals ED 126 and BD 127 of the controller 120, respectively. Current 137 is sensed on the primary return line through the sense resistor $R_{CS}$ 136. In the example, the sensed current 137 is represented with the voltage drop on sense resistor $R_{CS}$, which is coupled to be received on the terminal CS 128 of the controller 120. In the example, the voltage drop on sense resistor $R_{CS}$ is with respect to the primary ground/reference 101, and is therefore negative as illustrated in FIG. 4A (460A) and FIG. 4B (460B). In the example, the base terminal of the BJT switching element 130 is coupled through a pull up resistor 132 to the input voltage. In one example, the emitter terminal is coupled through ED 126 through an internal switch of the controller 120, which is illustrated and described in further detail below in FIG. 3 (switch 388), is coupled to the primary ground/reference 101 and current sense resistor $R_{CS}$ 136.

Figure 2:
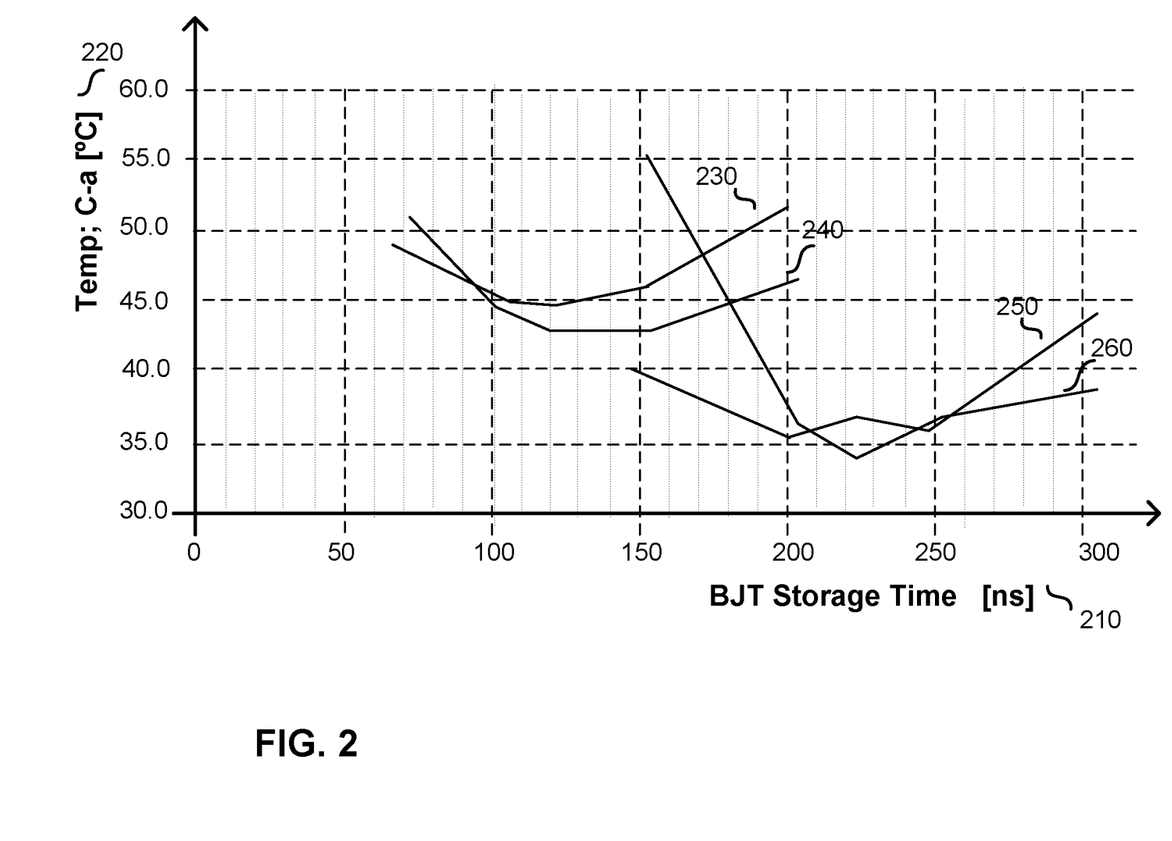
FIG. 2 is an example graph illustrating examples of ambient temperature rise of a BJT versus storage time with low and high input line voltages.

FIG. 2 is an example graph that illustrates the benefits of utilizing a dynamic adjustment in accordance with the teachings of the present invention of the storage time reference in a BJT driver versus the input voltage. As shown, FIG. 2 illustrates temperature rise vs. storage time for two different types of BJTs at low line and high line voltage examples. The graph of FIG. 2 shows on the vertical y-axis 220 the temperature rise of case to ambient, in degrees Celsius [° C.], for two different types of BJTs (Type 1 and type 2) versus their storage time in nanoseconds [ns] along the horizontal x-axis 210.

Graphs 230 and 240 are test results at high input line voltage (e.g., 220 $V_{AC}$) for two different types of BJT transistors referred as type 1 and type 2 respectively. Similarly graphs 250 and 260 are the test results in low input line voltage (e.g., 110 $V_{AC}$) for the same BJT transistors of type 1 and type 2 respectively.

These test results confirm that in high line if the adjustment of the storage time reference is not performed in accordance with the teachings of the present invention, that the temperature rise of the case to ambient for both types of the BJTs due to the extra switching loss will be higher. As will be discussed, examples in accordance with the teachings of the present invention utilize measurements of the storage time of a BJT that is used as a switching element in a power converter, and adjust the storage time reference versus the input line voltage to provide improved performance.

In test results illustrated in FIG. 2, the effect of a non-adjusted storage time reference in temperature rise (case to ambient) is shown for two types of BJTs that illustrate the benefit of a BJT storage time reference adjustment versus input line variations in accordance with the teachings of the present invention. As will be discussed, a new controller block in accordance with the teachings of the present invention provides compensation with dynamic adjustment of the BJT storage time reference versus input line variations.

To illustrate, FIG. 3 shows generally a schematic of an example power converter, as well as the internal block interconnections of an example controller for a BJT switching device of the power converter, in accordance with the teachings of the present invention. As will be described, the internal block interconnections of the illustrated controller provide input line voltage monitoring and modeling, measurement of the storage time in each switching cycle, and dynamic adjustment of the storage time reference in accordance with the teachings of the present invention. In particular, in one example, power converter 300 includes a controller 320 that includes internal blocks for input line voltage monitoring/modeling, storage time measurement in each switching cycle, and dynamic adjustment of the storage time reference.

As shown in the depicted example, power converter 300 includes an energy transfer element 340, which in one example is a high frequency transformer or coupled inductor, having a first winding (e.g., primary winding) 341 and a second winding (e.g., secondary winding) 342 coupled between an input and an output of power converter 300. As shown in FIG. 3, the input of power converter 300 is coupled to receive an input voltage $V_{IN}$ 310. Energy is transferred through the energy transfer element 340 to an output circuitry 350 referenced to secondary ground/reference 351 that is isolated from the primary ground/reference 301. The output circuitry 350 as depicted in FIG. 1 may include a rectifier diode, an output capacitor and a load coupled to the output that receives an output voltage $V_O$ and an output current $I_O$.

In the depicted example, the switching element 330 includes a BJT and is coupled to the first winding 341 of the energy transfer element 340. A controller 320 is coupled to control switching of the BJT switch 330 with a base drive signal from terminal BD 327 of controller 320 to control a transfer of energy from the input of power converter to the output of power converter through the energy transfer element 340 in response to a feedback FB signal received on terminal 322 of the controller 320. In one example, an output quantity of power converter 300 may be representative of the output voltage $V_O$, output current $I_O$, or a combination thereof, as shown for example in FIG. 1.

A third winding (e.g., auxiliary winding) 343 on the magnetic core of energy transfer element (e.g., transformer) 340 generates a supply voltage through the rectifier diode $D_{AUX}$ 345 and a filter capacitor $C_{AUX}$ 348 across the supply terminal (e.g., bypass pin) BP 325 of the controller 320 that is referenced to the primary ground/reference 301, coupled to GND terminal 321 of the controller 320. In one example, the regulation of the output is responsive to the feedback signal retrieved from the non-rectified voltage on the auxiliary winding 343 that is coupled to the feedback terminal FB 322 of the controller 320. In example schematic illustrated in FIG. 3 in comparison to the example schematic of FIG. 1, there is no scaling down resistive divider, and the FB signal is based on the turns ratio of the primary to auxiliary windings (e.g., $N_{WAUX}/N_{W1}$) and is directly coupled to the controller terminal FB 322.

The emitter and base terminals of the BJT switching element 330 are coupled to the terminals ED 326 and BD 327 of the controller 320 respectively. The BJT collector current 335 during the conduction time of the BJT switching element 330 is conducted through the ED terminal 326 of the controller 320 and through an internal switch 388, which may be coupled to the ground terminal GND 321 of the controller 320. The collector current passes through the primary side return line and is sensed as the current 337 through the sense resistor $R_{CS}$ 336.

Figure 4B:
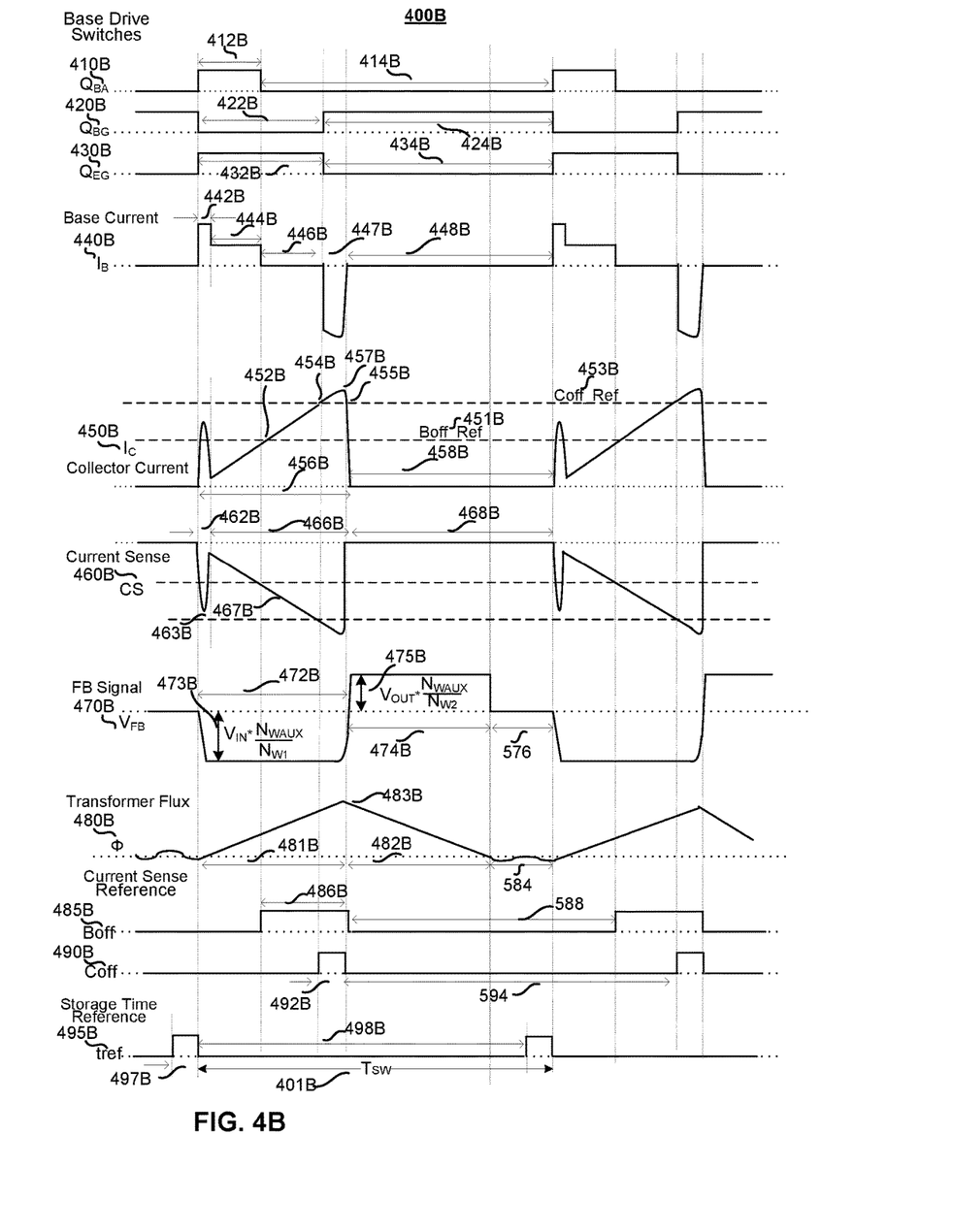
FIG. 4B is a graph illustrating waveforms and relationships between example signals with a high line for a BJT controller blocks with dynamic storage time reference in accordance with the teachings of the present invention.

As mentioned above with respect to FIG. 1, the primary side return line current 337 sensed on resistor $R_{CS}$ 336 that is applied to terminal CS 328 of the controller 320 shows as a negative signal with respect to the primary ground, which is illustrated as signal $V_{CS}$ 460A in FIG. 4A, and in FIG. 4B as $V_{CS}$ 460B).

As shown in the example depicted in FIG. 3, controller 320 processes multiple sensed and received input signals representative of the various parameters of the power converter 300 and generates a control signal BD 327 to control the on and off states of the BJT switching element 330 to regulate the output of the power supply in a closed loop. The FB signal on terminal FB 322 is received from the auxiliary winding 343, which in the example is a non-rectified AC pulse signal, as shown for example in FIG. 4A as FB signal 470A, and in FIG. 4B as FB signal 470B. During the on-time when BJT is conducting, the induced voltage in the auxiliary winding 343 is negative, due to the anti-phase of the auxiliary winding 343 in relation to the primary winding 341, and is representative of the input voltage. The scale factor for the monitored input voltage may be presented by $V_{IN}*N_{WAUX}/N_{W1}$, where $N_{W1}$ is the number of winding turns of the primary winding, and $N_{WAUX}$ is the number of winding turns of the auxiliary winding.

During the on-time, the secondary current is blocked by the reverse biased output diode, which is illustrated for example in FIG. 1 as D1 152. However, the increased flux in the magnetic core stores the energy, and when the BJT switch turns off or stops conducting, the output diode, which is illustrated for example in FIG. 1 as D1 152, would be forward biased to transfer the stored energy to the output load. The signal on FB terminal 322 during the BJT off-time (e.g., when output diode D1 152 conducts) represents the scaled output voltage, $V_O*N_{WAUX}/N_{W2}$, where $N_{WAUX}$ is the number of auxiliary winding turns, and $N_{W2}$ is the number of secondary winding turns.

The output regulator block 360 in controller 320 receives the AC feedback signal from terminal FB 322 and extracts the positive half cycles that are representative of the output voltage to regulate the output. The signal 361 from output regulator block 360 is coupled to be received by the BJT control unit 380. In one example, the BJT control unit 380 is coupled to control the on and off timing of the switches 384, 386 and 388 in the BJT driver 390 in response to the signal 361. It is appreciated that either the on-time (e.g., duty cycle control, PWM) or the switching period (e.g., frequency control, PFM) may be controlled to achieve a regulated output versus load and input voltage variations.

The BJT driver 390 receives the supply voltage on the $V_{CC}$ bus 391 from terminal BP 325 of the controller 320 coupled to the rectified auxiliary voltage across the $C_{AUX}$ capacitor 348. The base drive current $I_{BD}$ is generated from $V_{CC}$ bus 391 through the controlled current source 382, which is controlled by signal 381 from the BJT control unit 380. In one example, current source 382 is a variable current source that provides a variable current from zero to a desired level of base drive current $I_{BD}$. Switch 384, which is controlled by signal $Q_{BA}$ 383 from the BJT control unit 380, conducts the $I_{BD}$ current through node M 392 and through BD terminal 327 to the base of BJT 330. In one example, switch 384 is optional in an example in which the current source 382 is variable from zero to the desired base drive current $I_{BD}$. Pulse width of the control signal $Q_{BA}$ 383 defines duration of the base current to the BJT switch 330. Switch 386 across node M 392 to ground GND 321 is controlled by signal $Q_{BG}$ 385 and may couple the base of BJT 330 to GND 321 to provide a discharge path for the storage charge of BJT at turn-off. The BJT drive signal from node M 392 is coupled to the terminal BD 327 of the controller 320. The emitter of BJT 330 is coupled to terminal ED 326 of the controller 320 and through a switch 388 it is coupled to GND 321.

Switch 388 is controlled by the signal $Q_{EG}$ 387 from the BJT control unit 380. Control signal $Q_{EG}$ 387 is complementary of signal $Q_{BG}$ 385. For the duration of time that switch 386 is open, switch 388 remains closed and conducts the BJT current 335 to the current sense resistor $R_{CS}$ 336 on the primary return line. The sensed current across the resistor $R_{CS}$ 336 is applied to terminal CS 328. The input current $I_{IN}$ peak regulator block 373 receives the sensed current and limits the peak current in each switching cycle against a predefined current limit threshold to generate the signal Coff_Ref 375, which is a reference for the collector turn off.

Signal Coff_Ref 375 on the positive input 374 of the current comparator 376 is compared to the sensed current 377 on the negative input of the current comparator and generates signal Coff 378 that may be used to define duration of the storage time. The Coff signal 378 is fed back to the second input of the storage time regulator block 368. The storage time regulator block 368 processes combination of the two input signals, $t_{ref}$ 367 and Coff 378, and generates signal Boff_Ref 369, which is a reference signal for the base turn off. After the base switch 384 is turned off by signal $Q_{BA}$ 381 going low, which is illustrated in FIG. 4A as $Q_{BA}$ 410A, the collector current continues to rise until the signal $Q_{EG}$ 387, which is illustrated in FIG. 4A as $Q_{EG}$ 430A, commands to turn off the emitter switch 388, which is illustrated in FIG. 4A as time tst1 454A.

The storage time reference signal $t_{ref}$ 367 is generated in response to the input voltage of the power converter. Signal $t_{ref}$ 367 dynamically represents the input voltage to regulate the storage time through the storage time regulator block 368. Signal Coff 378 may be used to define the storage time that represents the discharge time required for the stored charge in the junction of BJT before its complete turn off. In the depicted example, the BJT storage time is defined and measured through the signal Coff in accordance with the teachings of the present invention. The start point for storage time is when the emitter switch 388 has turned off by signal $Q_{EG}$ 387 going low, which is shown with signal 430A in FIG. 4A and is presented by the intersection point tst1 454A in graph 450 in FIG. 4A. During the storage discharge interval, as indicted in FIG. 4A at reference numeral 447A, the collector current 450A due to the base discharge current through switch 386, which is closed by signal 385 $Q_{BG}$ going high in graph 420A of FIG. 4A, continues until time tst2, which occurs at intersection 455A, at which time the collector current 450A bends back towards zero as shown.

It is appreciated that when the emitter drive switch 388 is turned off, the base to ground switch 386 is simultaneously turned on by the signal $Q_{BG}$ 385 going high, which is indicated with signal 420A in FIG. 4A, to discharge the BJT 330 junction storage charge. When switch 388 disconnects the emitter current path, the BJT 330 may completely turn off only after the storage time period, which is indicated in FIG. 4A with reference numeral 447A. The storage time is indicated with the intersections of Coff_Ref 453A with the collector current 450A, between time tst1 454A to time tst2 455A, at which time the collector current folds back towards zero.

Signal "Boff_Ref" 369 is coupled to the positive input of the comparator 370. The negative input receives the sensed collector current as a voltage signal $V_{CS}$ on the terminal CS 328. The output signal Boff 372 of the comparator 370 would be logic high as long as the sensed current signal $V_{CS}$ is lower than Boff_Ref 369 and drops to logic low as soon as the sensed collector current signal $V_{CS}$ hits the Boff_Ref 369 to turn off the base current.

The AC feedback signal derived from terminal FB 322 is received by the $V_{IN}$ model block 362, which is coupled in parallel with the output regulator block 360 in FIG. 3 as shown. A model of the input voltage that is generated by the $V_{IN}$ model block 362 is buffered through driver 363. Modeling of the input voltage may be as simple as extracting the negative portions of the signal FB 322, or in another example by forcing a current out of the example controller 320 during the negative portions to hold the signal FB 322 node at zero, and measuring the forced current as a representation of the input voltage. The sampled input voltage may then be latched through the sample latch block 364. It is appreciated that even though the sample latch block 364 is described in the example controller of FIG. 3, it is optional and in other examples, the controller may function without latching the sampled input voltage. The signal 365 output from sample latch block 364 is representative of the input voltage, and is coupled to be received by the storage time reference block 366. The storage time reference block 366 generates the $t_{ref}$ signal 367 received by the storage time regulator block 368.

In one example controller 320 may be implemented in an integrated circuit (IC) and the BJT 330 switching element may also be monolithically or non-monolithically (e.g., hybrid) included in the same IC.

FIG. 4A and FIG. 4B illustrate the sample waveforms generated by the different function blocks of FIG. 3 at a low input line voltage and a high input line voltage, respectively, to illustrate the dynamic measurement and adjustment of the BJT storage time versus the input voltage variations in accordance with the teachings of the present invention. To avoid repetition, only the description for the low input line voltage waveforms are explained below in the graphs 400A of FIG. 4A. It is appreciated, however, that all of the explanations for both graphs 400A of FIG. 4A and graphs 400B FIG. 4B are substantially similar, except that for the high input line voltage the BJT conduction time (e.g., on-time) for the same power level would be shorter than the low input line voltage.

In the example described in FIG. 4A, graphs 400A are waveforms of the control signals utilized by a controller block for a BJT driver with the dynamic adjustment of the storage time reference versus the input line voltage variation in accordance with the teachings of the present invention. Graphs $Q_{BA}$ 410, $Q_{BG}$ 420, and $Q_{EG}$ 430 show the control signals for switch 384 (e.g., signal $Q_{BA}$ 383 in FIG. 3), switch 386 (e.g., signal $Q_{BG}$ 385 in FIG. 3) and switch 388 (e.g., signal $Q_{EG}$ 387 in FIG. 3) inside the BJT driver 390. A logic high of each signal means that switch is turned on (e.g., closed) and logic low means that switch is turned off (e.g., opened).

The graph of base current $I_B$ 440A illustrates the BJT base current from the controlled current source 382 and through switch 384, which shows the positive injected base current in portions 442A and 444A. The discharged current of the stored charge in BJT junction during the storage time that is shown as the negative portion 447A in graph of base current $I_B$ 440A, which illustrates the current though the switch 386 as indicated in graph $Q_{BG}$ 430A.

The graph of collector current $I_C$ 450A shows the BJT collector current in positive direction and the graph of current sense $V_{CS}$ 460A shows the sensed current signal $V_{CS}$ that is measured across the sense resistor on the primary return line that is negative in reference to the primary side controller ground. It is appreciated that the turn on current spikes 457A or 467A on the collector current $I_C$ waveform 450A, and consequently on the current sense signal $V_{CS}$ 460A, may happen mostly due to the parasitic/stray capacitance of the transformer windings.

In the graph of collector current $I_C$ 450A, the reference thresholds for the base switch off (e.g., Boff_Ref, 451A) and for the collector switch off (e.g., Coff_Ref, 453A) are illustrated in comparison to the BJT collector current, which is the on-time rising sloped current. These references or thresholds, Boff_Ref 451A (e.g., Boff_Ref 369A in FIG. 3) and Coff_Ref 453A (e.g., Coff_Ref, 375 in FIG. 3) define the switching signals for the BJT driver. In FIG. 3, the BJT driver 390 through the BJT control unit 380 generates the switching signals $Q_{BA}$ 383, $Q_{BG}$ 385, and $Q_{EG}$ 387 for the BJT driver switches 384, 386 and 388 respectively. It should be mentioned that in an example in accordance with the teachings of the present invention the pulse width 492A is a controlled variable. For instance, in one example, the pulse width 492A is controlled by modulating and changing the Boff_Ref 451 reference. The Boff_Ref 451 reference determines the pulse width 412A in graph $Q_{BA}$ 410A, which in turn determines the on-time of the switch 383 and the amount of charge delivered to the base of the BJT. The amount of charge delivered to the base of the BJT in turn determines the required discharge time (e.g., portion 447A), and the signal Coff 490A determines the pulse width of 492A. The signal Coff 490A is regulated so that the pulse width 492A is equal to the pulse 497A of the storage time reference $t_{ref}$ 495A.

The graph of FB signal 470A illustrates the FB AC signal in which the negative half cycle 472A represents the input line voltage, and the positive half cycle 474A gives the output feedback information. If BJT operation is in DCM, after the output current drops to zero and remains almost zero 476A until the next switching cycle starts.

The graph of transformer flux Φ 480A is an illustration of the transformer magnetic flux. During the first half cycle of BJT conduction period (e.g., on time), the transformer flux Φ 480A has a rising slope, and in the second half cycle when energy is transferring to the output, transformer flux Φ 480A has a falling slope. In DCM operation at the end of second half cycle when the output current is dropped to zero and transfer of energy is stopped, the transformer flux Φ 480A remains almost zero. It is appreciated that even though not shown in graphs 470A or 480A, when the transfer of energy is stopped, some idle ringing due to resonant charge/discharge of the parasitic capacitances may be observed.

The graph of current sense reference Boff 485A shows the current sense reference signal Boff for the base current turn off that goes to logic high as long as the BJT collector current Ic, or the sense current signal $V_{CS}$ in the negative direction, is higher than the Boff_Ref threshold.

The graph of Coff 490A shows the collector current turn off signal Coff and indicates that the collector current has reached the designated peak current threshold Coff_Ref. The pulse width of the Coff signal 490A is a measure of the storage time. This signal goes to logic high as long as the BJT collector current Ic, or the sense current signal $V_{CS}$ in negative direction, is higher than the Coff_Ref threshold (e.g., duration 492A between tst1 454A and tst2 455A).

The graph of storage time reference $t_{ref}$ 495A represents the storage time reference $t_{ref}$ with a pulse width 497A. This signal is generated in response to the input voltage of the power converter (e.g., through blocks 362, 363, 364 and 366 in FIG. 3). In each switching cycle, signal $t_{ref}$ 495A (e.g., $t_{ref}$ 367 in FIG. 3) in response to a latched value of the input voltage model through the storage time regulator block 368 generates signal Boff_Ref 451A, which is the base turn off reference threshold, to regulate the base turn off and the amount of the charge delivered to the BJT base for an optimum switching of the BJT power switch with the least turn off loss. The discharge time or storage time is defined by the time interval between tst1 454A and tst2 455A that the BJT collector current Ic 450A is higher than the Coff_Ref reference threshold 453A (e.g., signal Coff 490A high, duration 492A). In each switching cycle the discharge time follows (e.g., remains equal to) the $t_{ref}$ pulse duration 497A.

In operation, referring to FIG. 3 and FIG. 4A, in each switching cycle $T_{SW}$ 401A, signal 410A $Q_{BA}$ at the start of a switching cycle is logic high, and switch 384 is closed conducting the base drive controlled current $I_{BD}$ 382 to the base of the BJT switch 330 through the node M 392 and terminal BD 327 of the controller 320. The amount of the base current $I_{BD}$ 382 is controlled through signal 381 from BJT control unit 380. When the $Q_{BA}$ 410A signal is logic high (e.g., switch 384 is closed), the $Q_{BG}$ 420A signal is logic low (e.g., switch 386 is open) to prevent any discharge from the base of the BJT 330. The $Q_{EG}$ 430A signal remains logic high and switch 388 is closed to conduct the collector current 335, or its equivalent current 337 to the return line through the sense resistor 336.

The base current is represented by the signal $I_B$ 440A, where the amount of the base current at the start of each BJT switch on time for a duration 442A goes to a higher level to cover the junction capacitor inrush charge. After the junction capacitor inrush, the base current drops to a lower level for the rest of the BJT on-time 444A. At the end of duration 412A, the $Q_{BA}$ 410A signal drops from high to low. The base drive current turn off, which is the end of duration 412A on graph 410A, is defined on the graph of collector current $I_C$ 450A by the intersection point 452A of the collector current $I_C$ 450A and Boff_Ref 451A, which is the Boff_Ref 369 signal in FIG. 3. From this point, no current is injected to the BJT base, as shown for example with signal $Q_{BA}$ going low, switch 384 opening, and base current $I_B$ 440A dropping to zero. However, due to the BJT stored charge, the collector current $I_C$ 450A continues rising for a period of 446A up to the intersection point 454A with the Coff_Ref 453A, which is signal 375 in FIG. 3. The intersection point 454A is defined by the input current peak regulator, which is TIN peak regulator block 373 as described in FIG. 3. From this point, the stored charge in the BJT junction starts to discharge, and base current 440A goes negative for a discharge time duration 447A. The discharge time duration 447A is defined by the time duration from time tst1 (454A) to time tst2 (455A).

The time tst1 454A is when the $Q_{BG}$ 420A signal and the $Q_{EG}$ 430A signal change their states, which is when $Q_{BG}$ goes from low to high closing the switch 386, and $Q_{EG}$ goes from high to low opening the switch 388. However, due to discharge of the storage charge through switch 386, the collector current 450A continues increasing above the Coff_Ref 453A until the end of the discharge time, at which time it folds back falling towards the zero. The time tst2 455A is when all the stored charge in the BJT junction has discharged and the collector current 450A has dropped back below the Coff_Ref 453A. It is appreciated that the current sense signal $V_{SC}$ 460A, which is the voltage drop of the collector current 337 across the sense resistor 336 in FIG. 3, is only a negative representation of the collector current 450A.

At time tst1 454A the output of the comparator 376, which is the Coff 378 signal in FIG. 3, goes high until time tst2 455A, at which time it drops back to logic low. The pulse width 492A of the signal Coff 490A dynamically follows, or remains equal to, the pulse width 497A of the storage time reference signal $t_{ref}$ 495A represents the required discharge time and provides an easy dynamic and accurate measure to adjust the BJT storage time in each switching cycle in accordance with the teachings of the present invention.

Like FIG. 4A, FIG. 4B also illustrates the sample waveforms generated by the different function blocks of FIG. 3. In particular, FIG. 4A illustrates the sample waveforms at a low input line voltage, while FIG. 4B illustrates the sample waveforms generated by the different function blocks of FIG. 3 at a high input line voltage. It is appreciated that the description of the sample waveforms illustrated FIG. 4B are similar to the descriptions provided with respect to FIG. 4A, except that for the high line input voltage, the conduction time and storage time associated with the BJT in the sample waveforms in FIG. 4B is shorter at the high line input voltage compared to the low line input voltage.

It is also appreciated that for the simplicity with respect to the graphs illustrated in FIG. 4A and FIG. 4B, that any parasitic ringing has not been illustrated and that in other examples, parasitic ringing may occur due to the resonance of parasitic capacitances and inductances on the circuit board, which may cause some turn on and turn off oscillations.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A controller for a switched mode power converter, wherein the switched mode power converter includes a switching element comprising a bipolar junction transistor (BJT) power switch, wherein the switched mode power converter further includes an energy transfer element with a primary side coupled between an input of the switched mode power converter and the BJT power switch, and a secondary side coupled to an output of the switched mode power converter, wherein the controller comprises:

a driver circuit coupled to receive control signals to control switching of the BJT power switch in response to an output signal representative of an output of the switched mode power converter to regulate a transfer of energy from the input of the power converter to the output of the power converter; and control circuit coupled to generate the control signal to control said switching of BJT power switch, wherein the control circuit includes:

a storage time reference circuit coupled to receive a signal representative of an input of the switch mode power converter and generating a storage time reference signal in response thereto;

a first comparator coupled to generate a collector off signal for the BJT power switch in response to a first comparison of a switch current sense signal and a collector off reference signal;

a storage time regulator circuit coupled to generate a base off reference signal in response to the storage time reference signal and the collector off signal; and a second comparator coupled to generate a base off signal in response to a second comparison of the switch current sense signal and the base off reference signal, wherein the driver circuit is further coupled to discontinue charging a base terminal of the BJT power switch in response to the base off signal, and wherein the driver circuit is further coupled to start discharging the base terminal of the BJT power switch in response to the collector off signal during a switching cycle of the BJT power switch.

2. The controller of claim 1, wherein an ac feedback (FB) signal from an auxiliary winding on the energy transfer element may represent the output of switched mode power converter in a portion of the ac signal period and may represent the input of switched mode power converter in another portion of the ac signal period.

3. The controller of claim 1, further comprising an output regulator circuit coupled to receive the ac FB signal, wherein the output regulator is coupled to generate the output signal in response to the portion of the ac signal representing the output of the power converter.

4. The controller of claim 2, wherein the output signal is an output voltage signal.

5. The controller of claim 2, wherein the output signal is an output current signal.

6. The controller of claim 1, further comprising an input modeling circuit coupled to receive the ac FB signal from the auxiliary winding on the energy transfer element of the switched mode power converter, wherein the input voltage modeling circuit is coupled to generate an input signal in response to the portion of the ac FB signal representing the input of the power converter.

7. The controller of claim 6, wherein the input signal is an input voltage signal.

8. The controller of claim 6, wherein the input signal is an input current signal.

9. The controller of claim 6, further comprising a latch coupled to generate a latched input signal representative of the input of the power converter in each switching cycle of the BJT power switch.

10. The controller of claim 1 wherein the driver circuit further comprises:
   a current source coupled to provide a base drive current; and
   a first switch coupled between the current source and the base terminal of the BJT power switch, wherein the driver circuit is coupled to turn on the first switch to charge the base terminal of the BJT power switch with the base drive current, and wherein the driver circuit is coupled to turn off the first switch to discontinue charging the base terminal of the BJT power switch with the base drive current.

11. The controller of claim 1, wherein the driver circuit further comprises a variable current source coupled to provide a variable base drive current to the base terminal of the BJT power switch, wherein the variable base drive current varies from zero to a desired level of base current.

12. The controller of claim 10, wherein the driver circuit further comprises a second switch coupled between the base terminal of the BJT power switch and a ground terminal, wherein the driver circuit is coupled to turn on the second switch to start discharging the base terminal of the BJT power switch.

13. The controller of claim 12, wherein the driver circuit further comprises a third switch coupled to the BJT power switch, wherein the driver circuit is coupled to turn on the third switch to conduct the switch current of the BJT power switch to a current sense resistor coupled to provide the current sense signal.

14. The controller of claim 13, wherein the ground terminal is further coupled between the third switch and the current sense resistor.

15. The controller of claim 1, wherein the storage time reference circuit is further coupled to adjust the storage time reference signal in response to variations in the input signal.

16. The controller of claim 1 further comprising an input current peak regulator circuit coupled to generate the collector off reference signal in response to the current sense signal.

* * * * *